United States Patent
Wu et al.

(10) Patent No.: US 8,758,984 B2
(45) Date of Patent: Jun. 24, 2014

(54) METHOD OF FORMING GATE CONDUCTOR STRUCTURES

(75) Inventors: Chang-Ming Wu, New Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 224 days.

(21) Appl. No.: 13/103,108

(22) Filed: May 9, 2011

(65) Prior Publication Data

US 2012/0288802 A1    Nov. 15, 2012

(51) Int. Cl.
*H01L 21/70* (2006.01)

(52) U.S. Cl.
USPC .............. 430/314; 430/316; 430/318

(58) Field of Classification Search
CPC ... G03F 7/36; H01L 21/022; H01L 21/02214; H01L 21/02697; H01L 21/027; H01L 21/64
USPC .......................... 430/314, 316, 318
See application file for complete search history.

(56) References Cited

U.S. PATENT DOCUMENTS

| 6,955,961 | B1 | 10/2005 | Chung | |
|---|---|---|---|---|
| 2004/0191998 | A1* | 9/2004 | Natzle et al. | 438/300 |
| 2008/0242100 | A1* | 10/2008 | Yang et al. | 438/736 |
| 2009/0104763 | A1 | 4/2009 | Ahn | |
| 2010/0078823 | A1* | 4/2010 | Beyer et al. | 257/773 |

FOREIGN PATENT DOCUMENTS

TW    201027749 A1    7/2010

* cited by examiner

*Primary Examiner* — Daborah Chacko Davis
(74) *Attorney, Agent, or Firm* — Winston Hsu; Scott Margo

(57) ABSTRACT

A method of forming gate conductor structures. A substrate having thereon a gate electrode layer is provided. A multi-layer hard mask is formed overlying the gate electrode layer. The multi-layer hard mask comprises a first hard mask, a second hard mask, and a third hard mask. A photoresist pattern is formed on the multi-layer hard mask. A first etching process is performed to etch the third hard mask, using the photoresist pattern as a first etch resist, thereby forming a patterned third hard mask. A second etching process is performed to etch the second hard mask and the first hard mask, using the patterned third hard mask as a second etch resist, thereby forming a patterned first hard mask. A third etching process is performed to etch a layer of the gate electrode layer, using the patterned first hard mask as a third etch resist.

11 Claims, 3 Drawing Sheets

METHOD OF FORMING GATE CONDUCTOR STRUCTURES

BACKGROUND OF THE INVENTION

1. Field of the Invention

The present invention relates generally to the semiconductor processing. More particularly, the present invention relates to a method of forming gate conductor structures with improved line edge roughness (LER) and reduced resist budget.

2. Description of the Prior Art

As known in the art, one limitation to achieving smaller sizes of IC device features is the capability of conventional lithography. Lithography is the process by which a pattern or image is transferred from one medium to another. Conventional IC lithography uses ultra-violet (UV) sensitive photoresist. UV light is projected to the photoresist through a reticle or mask to create device patterns on an IC. Conventional IC lithographic processes are limited in their ability to print small features, such as contacts, trenches, polysilicon lines or gate conductor structures.

Generally, conventional lithographic processes (e.g., projection lithography and EUV lithography) do not have sufficient resolution and accuracy to consistently fabricate small features of minimum size. Resolution can be adversely impacted by a number of phenomena including: wavelength of light, diffraction of light, lens aberrations, mechanical stability of the resist, contamination, optical properties of resist, resist contrast, resist swelling, thermal flow of resist, etc. As such, the critical dimensions of contacts, trenches, gates, and, thus, IC devices, are limited in how small they can be.

Another difficulty arising from the continuing small dimensions involved in the creation of gate conductor structures is the tendency in the lithography process to experience resist erosion, pattern collapse, uncontrolled line edge roughness (LER). Typically, to etch fine gate conductor lines or structures on a substrate, a thick photoresist (high resist budget) and a single hard mask are used. However, severe corner rounding defects are found at the upper portion of the hard mask, which adversely affects the integrity of the gate conductor and results in worsened LER.

SUMMARY OF THE INVENTION

It is one object of the present invention to provide an improved method of forming fine semiconductor structures such as gate conductor structures with improved line edge roughness (LER) and reduced resist budget.

According to one aspect, the invention provides a method of forming gate conductor structures. First, a substrate having thereon a gate electrode layer comprising a first layer and a second layer overlying the first layer is provided. A multi-layer hard mask is formed overlying the gate electrode layer. The multi-layer hard mask comprises a first hard mask, a second hard mask overlying the first hard mask, and a third hard mask overlying the second hard mask. A photoresist pattern is then formed on the multi-layer hard mask. A first etching process is performed to etch the third hard mask, using the photoresist pattern as a first etch resist, thereby forming a patterned third hard mask. A second etching process is performed to etch the second hard mask and the first hard mask, using the patterned third hard mask as a second etch resist, thereby forming a patterned first hard mask. Subsequently, a third etching process is performed to etch the second layer of the gate electrode layer, using the patterned first hard mask as a third etch resist, thereby forming a patterned second layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
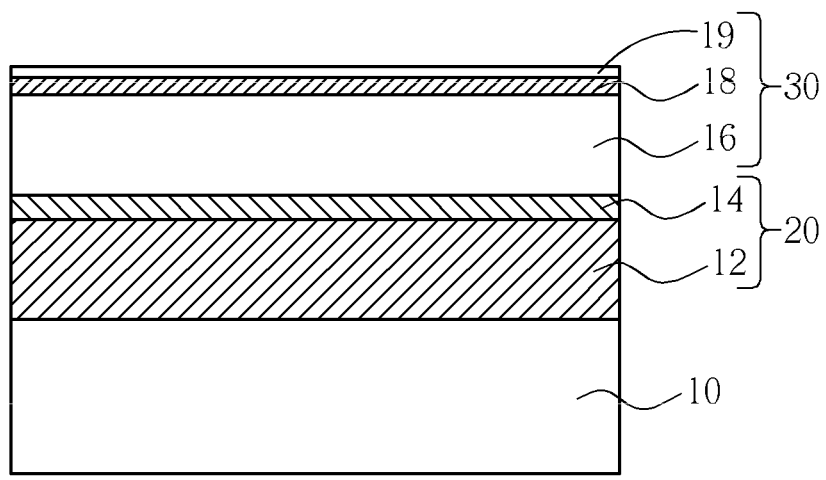
FIGS. 1-6 illustrates an exemplary method of making gate conductors on a semiconductor substrate utilizing a tri-layer (resist) hard mask scheme in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane Without the intention of a limitation, the invention will now be described and illustrated with the reference to preferred embodiments. FIGS. 1-6 illustrates an exemplary method of making gate conductor structures on a semiconductor substrate utilizing a tri-layer (resist) hard mask scheme in accordance with one embodiment of this invention. First, as shown in FIG. 1, a semiconductor substrate 10 is provided. As the term is used herein, "semiconductor substrate" refers to any construction comprising the semiconductor material, including, but not limited to, bulk semiconducting materials, such as a semiconductor wafer, and semiconducting material layers (either alone or in assemblies comprising other materials).

A gate electrode layer 20 is formed on the horizontal main surface of the semiconductor substrate 10. In one embodiment, the gate electrode layer 20 may comprise a single layer, bi-layer, or multi-layer structure including, but not limited to, polysilicon, tungsten, tungsten nitride, titanium, titanium nitride, or combinations thereof. However, it is to be understood that other metals or metal alloys may be used. For example, the gate electrode layer 20 may comprise polysilicon layer 12 and tungsten/tungsten nitride bi-layer 14 overlying the polysilicon layer 12.

Subsequently, a tri-layer hard mask 30 is formed on the gate electrode layer 20. According to the embodiment, the tri-layer hard mask 30 may comprise a first hard mask 16 of silicon nitride or silicon oxy-nitride/silicon nitride bi-layer, a second hard mask 18 of polysilicon overlying the first hard mask 16, and a third hard mask 19 of silicon oxide such as TEOS oxide overlying the second hard mask 18. For example, the second hard mask 18 of polysilicon may have a thickness of about 40 nm and the third hard mask 19 of silicon oxide may have a thickness of about 40 nm.

According to the embodiment, the tri-layer hard mask 30 has an etching selectivity ratio of about 4:1 either between the first hard mask 16 and the second hard mask 18 or between the first hard mask 16 and the third hard mask 19. The term "etching selectivity ratio" is defined as the ratio of the etching rate on the layer aimed to be etched to the etching rate on the nearby layer. According to the embodiment, the tri-layer hard mask 30 has an etching selectivity ratio ranging between about 6:1 and 10:1 between the second hard mask 18 and the third hard mask 19. In another embodiment, the second hard mask 18 of polysilicon may swap position with the third hard mask 19 of silicon oxide to form a SiON/SiN-TEOS oxide-polysilicon hard mask stack.

Figure 2:
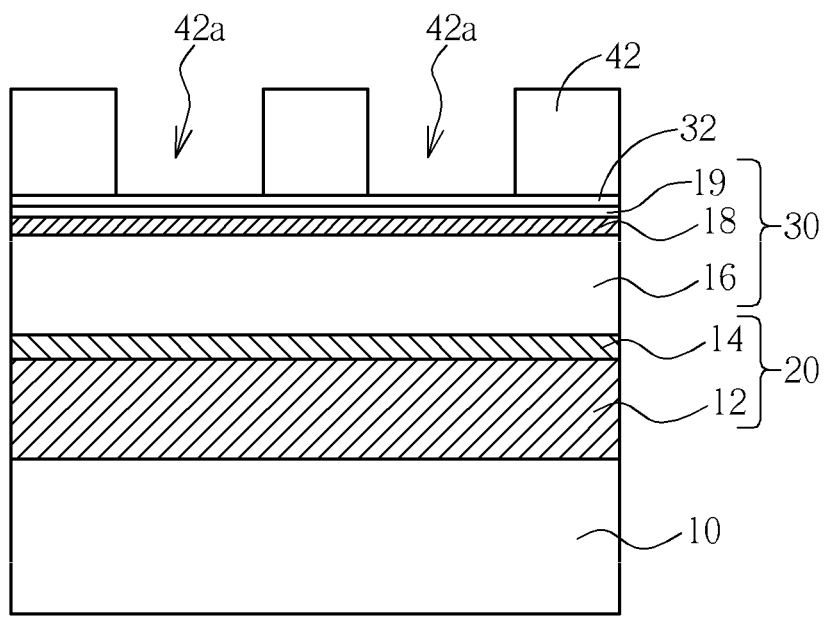

As shown in FIG. 2, an anti-reflection coating (ARC) layer 32 is deposited overlying the tri-layer hard mask 30. Thereafter, a photoresist pattern 42 is formed on the ARC layer 32. The photoresist pattern 42 includes a plurality of openings 42a that expose a portion of the underlying ARC layer 32. The photoresist pattern 42 may be formed by a known lithography method including, but not limited to, the steps of resist coating, pre-baking, exposure, post-baking, soft-baking, developing, etc. In the embodiment, the photoresist pattern 42 defines the gate conductor pattern based on a ground rule. It is to be understood that the dimension of the photoresist pattern 42 may be beyond a resolution limit of a used lithography tool by using, for example, double exposure methods or pitch doubling methods. Further, a trimming process may be carried out to shrink the dimension of the photoresist pattern 42.

Figure 3:
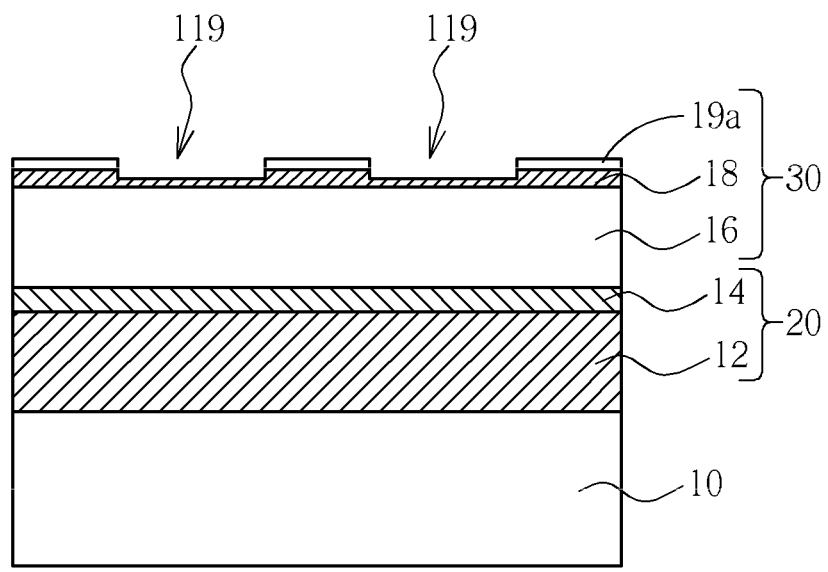

As shown in FIG. 3, a first dry etching process is carried out to etch the ARC layer 32 and the third hard mask 19 through the openings 42a to thereby transfer the gat conductor pattern from the photoresist pattern 42 into the third hard mask 19. After the first dry etching process, the photoresist pattern 42 may be removed or stripped by a known process to form a patterned third hard mask 19a carrying the gate conductor pattern. It is to be understood that the first dry etching process stops on the second hard mask 18 and may slightly over-etch into the second hard mask 18 to form recesses 119.

Figure 4:
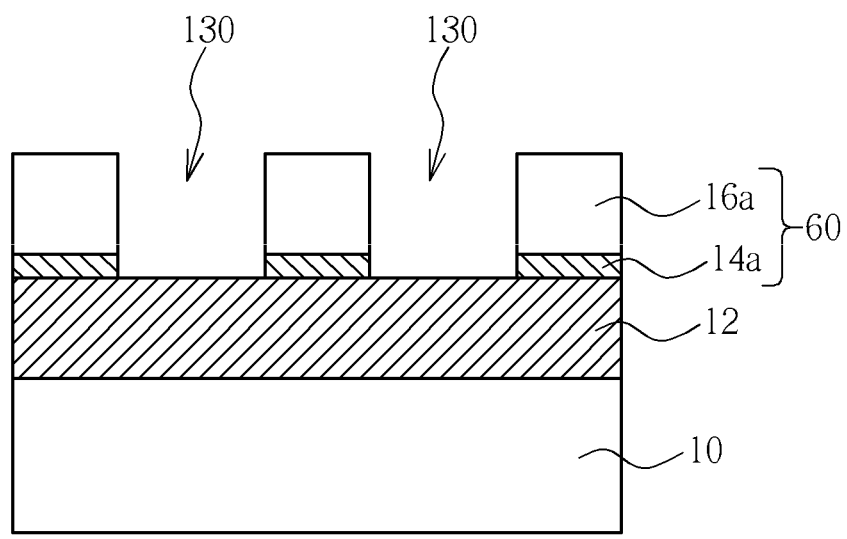

As shown in FIG. 4, using the patterned third hard mask 19a as an etching resist, a second dry etching process is then carried out to selectively etch the second hard mask 18 and the first hard mask 16, which are not covered by the patterned third hard mask 19a. At this point, the gate conductor pattern is transferred into the first hard mask 16, to thereby form a patterned first hard mask 16a. During the etch of the first hard mask 16, the patterned third hard mask 19a may be totally consumed.

Subsequently, a third dry etching process may be carried out to etch the exposed tungsten/tungsten nitride bi-layer 14 of the gate electrode layer 20, thereby forming recesses 130 and patterned layer 14a. The patterned layer 14a and the patterned first hard mask 16a constitute a film stack 60. In one embodiment, the second and third dry etching processes may be carried out in the same chamber. During the etch of the tungsten/tungsten nitride bi-layer 14, the second hard mask 18 may be totally consumed, while leaving the first hard mask 16 substantially intact. The invention tri-layer or multi-layer hard mask 30 is capable of protecting the first hard mask 16 from corner rounding erosion, and thus keeping the integrity of the gate conductor profile.

Figure 5:
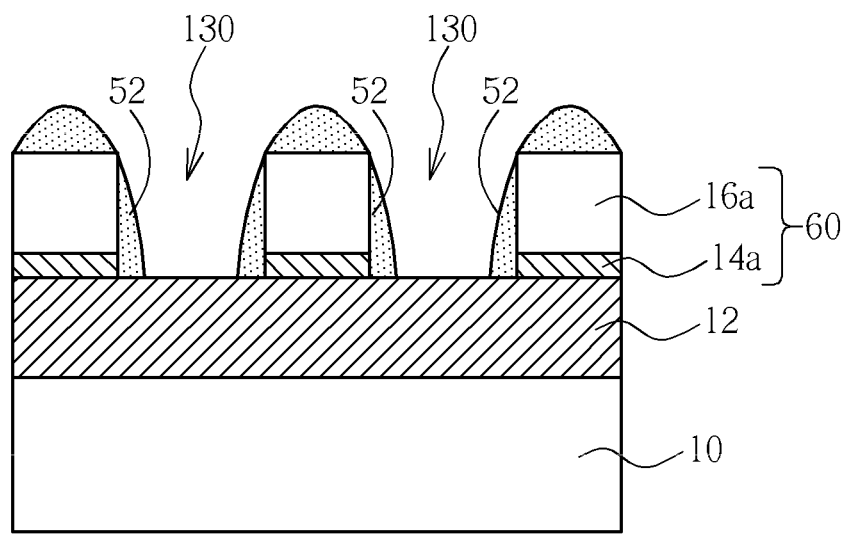
Figure 6:
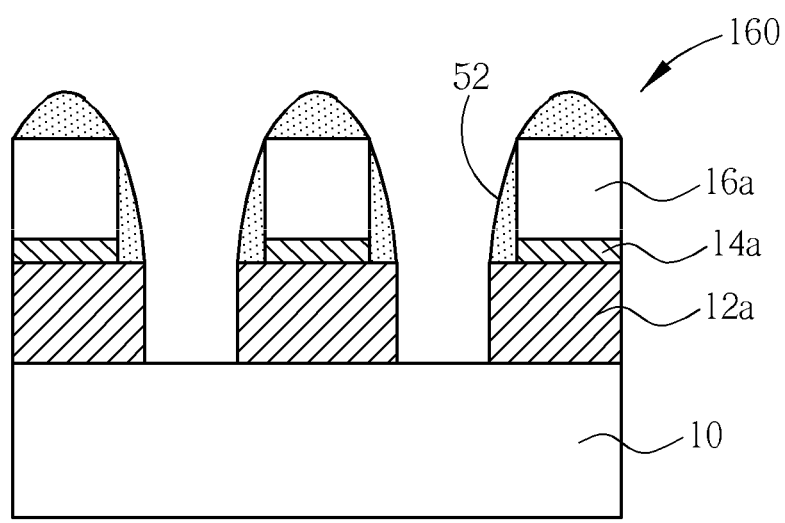

Subsequently, as shown in FIG. 5, a spacer 52 such as silicon nitride spacer is provided to encapsulate the film stack 60. After the formation of the spacer 52, a self-aligned, fourth dry etching process is carried out to etch the polysilicon layer 12 of the gate electrode layer 20, to thereby form a patterned polysilicon layer 12a under the film stack 60, as shown in FIG. 6. At this point, the gate conductor structures 160 are completed.

Those skilled in the art will readily observe that numerous modifications and alterations of the device and method may be made while retaining the teachings of the invention.

What is claimed is:

1. A method of forming gate conductor structures, comprising:
   providing a substrate having thereon a gate electrode layer comprising a first layer and a second layer overlying the first layer;
   forming a multi-layer hard mask overlying the gate electrode layer, the multi-layer hard mask comprising a first hard mask, a second hard mask overlying the first hard mask, and a third hard mask overlying the second hard mask;
   forming a photoresist pattern on the multi-layer hard mask;
   performing a first etching process to etch the third hard mask, using the photoresist pattern as a first etch resist mask, thereby forming a patterned third hard mask;
   performing a second etching process to etch the second hard mask and the first hard mask, using the patterned third hard mask as a second etch resist mask, thereby forming a patterned first hard mask, wherein the patterned third hard mask is totally consumed during the second etching process;
   performing a third etching process to etch the second layer of the gate electrode layer, using the patterned first hard mask as a third etch resist mask, thereby forming a patterned second layer;
   forming a patterned spacer encapsulating the patterned first hard mask and the patterned second layer, wherein the patterned spacer also covers a top surface of the patterned first hard mask; and
   using the patterned spacer and the patterned first hard mask as a fourth etch resist mask, performing a fourth etching process to etch the first layer of the gate electrode layer in a self-aligned manner.

2. The method of forming gate conductor structures according to claim 1 wherein the first layer comprises polysilicon.

3. The method of forming gate conductor structures according to claim 1 wherein the second layer comprises tungsten, tungsten nitride, titanium, titanium nitride, or combinations thereof.

4. The method of forming gate conductor structures according to claim 1 wherein the second hard mask and the third hard mask are selected from a group consisting of polysilicon and silicon oxide.

5. The method of forming gate conductor structures according to claim 1 wherein the second hard mask comprises polysilicon.

6. The method of forming gate conductor structures according to claim 1 wherein the second hard mask comprises silicon oxide.

7. The method of forming gate conductor structures according to claim 6 wherein the silicon oxide is TEOS oxide.

8. The method of forming gate conductor structures according to claim 1 wherein the first hard mask comprises silicon oxy-nitride or silicon nitride.

9. The method of forming gate conductor structures according to claim 1 wherein the multi-layer hard mask has an etching selectivity ratio of about 4:1 either between the first hard mask and the second hard mask or between the first hard mask and the third hard mask.

10. The method of forming gate conductor structures according to claim 1 wherein the multi-layer hard mask has an etching selectivity ratio ranging between about 6:1 and 10:1 between the second hard mask and the third hard mask.

11. The method of forming gate conductor structures according to claim 1 wherein after the first etching process, the photoresist pattern is removed.

\* \* \* \* \*